(12) United States Patent
Huang et al.

(10) Patent No.: US 12,253,218 B2
(45) Date of Patent: Mar. 18, 2025

(54) GAS FILLING DOCKING TRAY AND GAS FILLING DEVICE

(71) Applicant: BRILLIAN NETWORK & AUTOMATION INTEGRATED SYSTEM CO., LTD., Miaoli County (TW)

(72) Inventors: Ching-Wei Huang, Miaoli County (TW); Min-Che Li, Miaoli County (TW); Sheng-Chi Hsu, Miaoli County (TW)

(73) Assignee: BRILLIAN NETWORK & AUTOMATION INTEGRATED SYSTEM CO., LTD., Miaoli County (TW)

( * ) Notice: Subject to any disclaimer, the term of this patent is extended or adjusted under 35 U.S.C. 154(b) by 140 days.

(21) Appl. No.: 18/310,223

(22) Filed: May 1, 2023

(65) Prior Publication Data
US 2024/0191842 A1  Jun. 13, 2024

(30) Foreign Application Priority Data
Dec. 8, 2022  (TW) .................................. 111147285

(51) Int. Cl.
*F17C 13/08*  (2006.01)
*H01L 21/673*  (2006.01)

(52) U.S. Cl.
CPC .......... *F17C 13/08* (2013.01); *F17C 2260/02* (2013.01); *F17C 2270/0518* (2013.01); *H01L 21/67393* (2013.01)

(58) Field of Classification Search
CPC .................. F17C 13/08; F17C 2260/02; F17C 2270/0518; H01L 21/67389; H01L 21/67393
See application file for complete search history.

(56) References Cited

U.S. PATENT DOCUMENTS 10,847,396 B2 * 11/2020 Bachlechner ........ G05D 7/0635

* cited by examiner

*Primary Examiner* — Timothy L Maust
(74) *Attorney, Agent, or Firm* — MUNCY, GEISSLER, OLDS & LOWE, P.C.

(57) ABSTRACT

A gas filling docking tray having a carrier substrate includes a base surface, a plurality of guide blocks, a plurality of positioning pins, and at least one pair of nozzles. The guide blocks are at least disposed on two opposite sides of the base surface to define a wafer carrier accommodation area, and each guide block includes a vertical portion substantially perpendicular to the base surface and an inclined portion located above and connected with the vertical portion. A height of an apex of each positioning pin relative to the base surface is greater than a height of an apex of the vertical portion and less than a height of an apex of the inclined portion relative to the base surface.

18 Claims, 7 Drawing Sheets

GAS FILLING DOCKING TRAY AND GAS FILLING DEVICE

CROSS-REFERENCE TO RELATED APPLICATION

This application claims the priority benefit of Taiwan application no. 111147285, filed Dec. 8, 2022. The entirety of the above-mentioned patent application is hereby incorporated by reference herein and made a part of this specification.

BACKGROUND

Field of the Invention

The invention relates to a gas filling docking tray and a gas filling device, particularly to a gas filling docking tray and a gas filling device capable of accurately guiding and positioning an object to be supported.

Description of the Related Art

A wafer carrier is used for storing or transporting wafers, and it must meet extremely high cleanliness standards. To prevent particle contamination of wafers inside the wafer carrier, it is necessary to introduce clean gas into the wafer carrier through a gas filling device. However, if the wafer carrier is not properly aligned with the gas filling docking tray when it is mounted on the gas filling docking tray, the gas filling device may not be able to reach an optimal inflation position. This may cause the inflation function to malfunction, reduce the airtightness between the gas filling docking tray and the wafer carrier, and decrease the positioning reliability during gas filling.

BRIEF SUMMARY OF THE INVENTION

According to one aspect of the invention, a gas filling docking tray includes a carrier substrate having a base surface, a plurality of guide blocks, a plurality of positioning pins, and at least one pair of nozzles. The guide blocks are at least disposed on two opposite sides of the base surface to define a wafer carrier accommodation area, and each guide block includes a vertical portion substantially perpendicular to the base surface and an inclined portion located above and connected with the vertical portion. The positioning pins are disposed in the wafer carrier accommodation area of the carrier substrate to position a wafer carrier, where a height of an apex of each positioning pin relative to the base surface is greater than a height of an apex of the vertical portion and less than a height of an apex of the inclined portion relative to the base surface, and the nozzles are disposed in the wafer carrier accommodation area.

According to another aspect of the invention, a gas filling docking tray includes a carrier substrate having a base surface, at least three guide blocks, a plurality of positioning pins, at least one pair of fixed nozzles, and at least one pair of retractable nozzles. The three guide blocks are disposed on a peripheral area of the base surface and spaced apart from each other to define a wafer carrier accommodation area, and each guide block includes a vertical portion substantially perpendicular to the base surface and an inclined portion located above and connected with the vertical portion. The positioning pins are disposed in the wafer carrier accommodation area of the carrier substrate to position a wafer carrier, where a height of an apex of each positioning pin relative to the base surface is greater than a height of an apex of the vertical portion and less than a height of an apex of the inclined portion. The fixed nozzles are disposed in the wafer carrier accommodation area, wherein a height of an apex of each fixed nozzle relative to the base surface is less than the height of the apex of the vertical portion. The retractable nozzles are disposed in the wafer carrier accommodation area, where a height of an apex of each retractable nozzle relative to the base surface is less than the height of the apex of each positioning pin and greater than the height of the apex of each fixed nozzle.

According to another aspect of the invention, a gas filling docking tray includes a carrier substrate having a base surface, a plurality of guide blocks, a plurality of positioning pins, at least one inlet port and at least one outlet port, an inflation module, an exhaust module and a control module. The guide blocks are at least disposed on two opposite sides of the base surface to define a wafer carrier accommodation area, and each guide block includes a vertical portion substantially perpendicular to the base surface and an inclined portion located above and connected with the vertical portion. The positioning pins are disposed in the wafer carrier accommodation area of the carrier substrate to position a wafer carrier, where a height of an apex of each positioning pin relative to the base surface is greater than a height of an apex of the vertical portion and less than a height of an apex of the inclined portion. The gas inlet and gas outlet are disposed in the wafer carrier accommodation area, the inflation module is in fluid communication with the at least one inlet port, the exhaust module in fluid communication with the at least one outlet port, and the control module is electrically connected to the inflation module and the exhaust module to control operations of the inflation module and the exhaust module.

Based on the above, the embodiments of the invention achieve at least one of the following advantages or effects. The inclined portion may cooperate with the vertical portion of the guide block to guide a wafer carrier to a preset position during the process of positioning the wafer carrier on a gas filling docking tray, thereby avoiding abnormal gas inflation caused by loading and unloading positional errors. Moreover, by setting height relationships among the positioning pin, the vertical portion and the inclined portion of the guide block, the process of placing the wafer carrier onto a carrier substrate can be smoother and ensure proper functioning of each part of the guide block. Additionally, by adjusting the height relationships among the fixed nozzles, retractable nozzles, positioning pin, vertical portion and inclined portion of the guide block, the positioning process of the wafer carrier can be smoother, and airtightness and positioning reliability during gas filling can be further ensured.

Other objectives, features and advantages of the invention will be further understood from the further technological features disclosed by the embodiments of the invention wherein there are shown and described preferred embodiments of this invention, simply by way of illustration of modes best suited to carry out the invention.

DETAILED DESCRIPTION OF THE INVENTION

In the following detailed description of the preferred embodiments, reference is made to the accompanying drawings which form a part hereof, and in which are shown by way of illustration specific embodiments in which the invention may be practiced. In this regard, directional terminology, such as "top," "bottom," "front," "back," etc., is used with reference to the orientation of the Figure(s) being described. The components of the present invention can be positioned in a number of different orientations. As such, the directional terminology is used for purposes of illustration and is in no way limiting. On the other hand, the drawings are only schematic and the sizes of components may be exaggerated for clarity. It is to be understood that other embodiments may be utilized and structural changes may be made without departing from the scope of the present invention. Also, it is to be understood that the phraseology and terminology used herein are for the purpose of description and should not be regarded as limiting. The use of "including," "comprising," or "having" and variations thereof herein is meant to encompass the items listed thereafter and equivalents thereof as well as additional items. Unless limited otherwise, the terms "connected," "coupled," and "mounted" and variations thereof herein are used broadly and encompass direct and indirect connections, couplings, and mountings. Similarly, the terms "facing," "faces" and variations thereof herein are used broadly and encompass direct and indirect facing, and "adjacent to" and variations thereof herein are used broadly and encompass directly and indirectly "adjacent to". Therefore, the description of "A" component facing "B" component herein may contain the situations that "A" component directly faces "B" component or one or more additional components are between "A" component and "B" component. Also, the description of "A" component "adjacent to" "B" component herein may contain the situations that "A" component is directly "adjacent to" "B" component or one or more additional components are between "A" component and "B" component. Accordingly, the drawings and descriptions will be regarded as illustrative in nature and not as restrictive.

Figure 1:
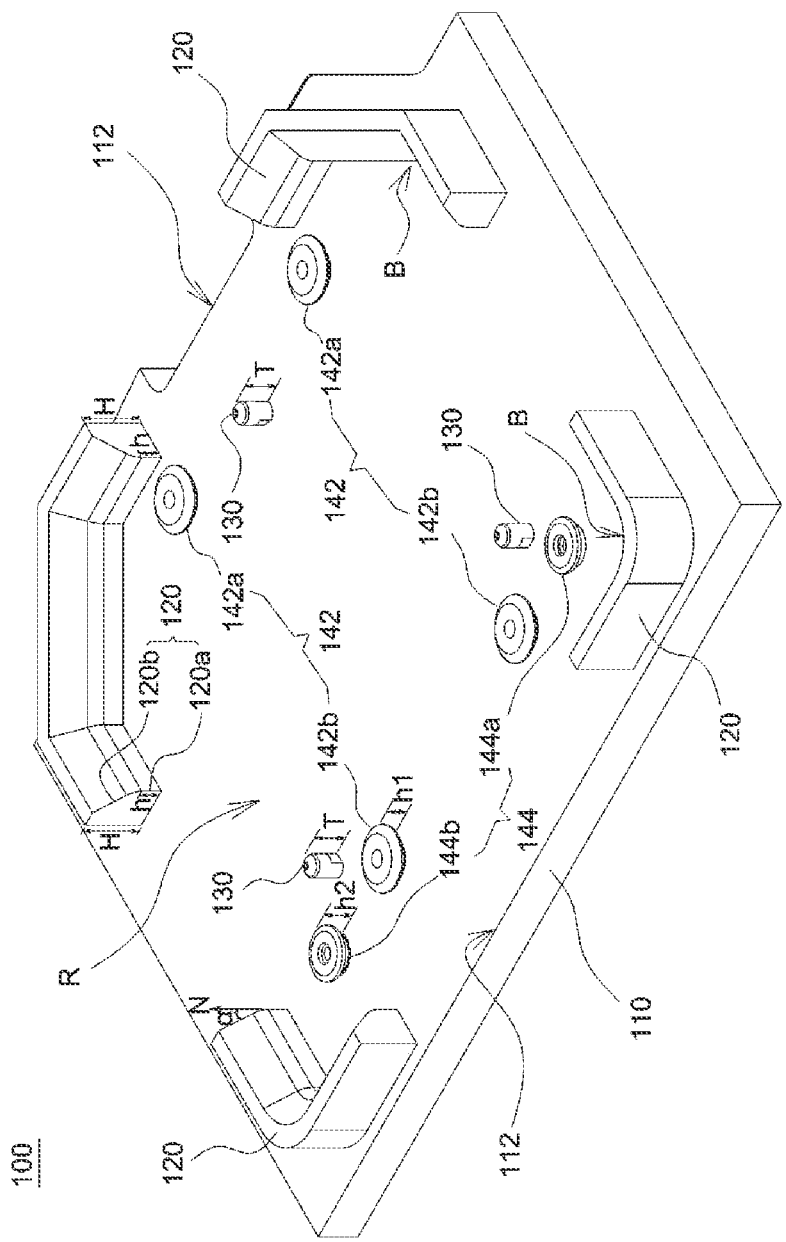
FIG. 1 is a schematic diagram of a gas filling docking tray according to an embodiment of the invention.
Figure 2:
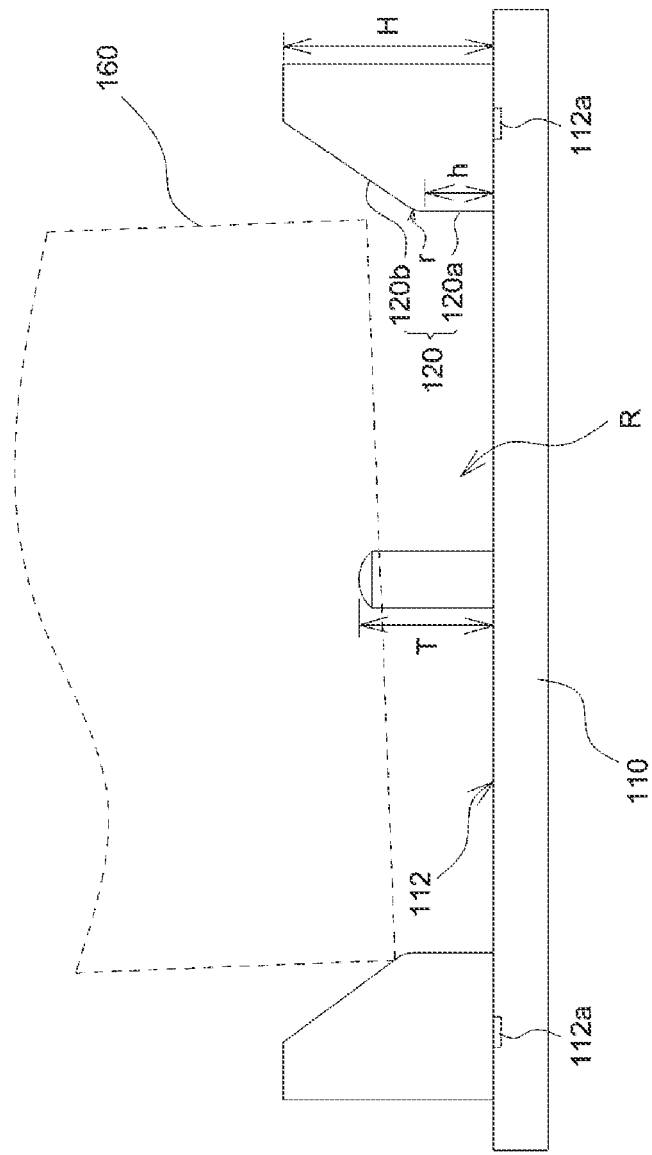
FIG. 2 is a schematic diagram showing the effect of guide blocks according to an embodiment of the invention.

FIG. 1 is a schematic diagram of a gas filling docking tray according to an embodiment of the invention. As shown in FIG. 1, the gas filling docking tray 100 may include a carrier substrate 110, a plurality of guide blocks 120, and a plurality of positioning pins 130. The carrier substrate 110 is provided with a base surface 112, and the plurality of guide blocks 120 are disposed on a peripheral area of the base surface 112 to define a wafer carrier accommodation area R, and the guide blocks 120 are at least disposed on two opposite sides of the base surface 112. In this embodiment, the guide blocks 120 are disposed around the base surface 112, and each guide block 120 has a bending structure B, but the invention is not limited thereto. The positioning pins 130 are disposed in the wafer carrier accommodation area R of the carrier substrate 110, and the function of the positioning pins 130 is to engage with a wafer carrier (not shown) to confine the wafer carrier in a predetermined position. In this embodiment, the number of positioning pins 130 is three, and the positioning pins 130 may be arranged in a triangular configuration in the accommodation area R to more firmly fix the wafer carrier in a correct inflation position, but the invention is not limited thereto. Each guide block 120 includes a vertical portion 120a substantially perpendicular to the base surface 112 and an inclined portion 120b located above and connected with the vertical portion 120a. In one embodiment, an angle α between the inclined portion 120b and a normal line N of the base surface 112 may range from 10 degrees to 70 degrees. In this embodiment, a height T of the apex of the positioning pin 130 relative to the base surface 112 is greater than a height h of the apex of the vertical portion 120a of the guide block 120 relative to the base surface 112, and the height T is smaller than the height H of the apex of the inclined portion 120b of the guide block 120 relative to the base surface 112. Please also refer to FIG. 2, where multiple guide blocks 120 are disposed on the base surface 112 to define a wafer carrier accommodation area R. By the above height difference designs of the vertical portion 120a and the inclined portion 120b of the guide block 120 relative to the positioning pin 130, during the process of positioning the wafer carrier 160 in the accommodation area R, the wafer carrier 160 can be first guided by the inclined portion 120b to touch the positioning pin 130, and then fallen along the vertical portion 120a to completely engage with the positioning pin 130. This allows to smooth the process of placing the wafer carrier 160 on the base surface 112 and ensure each part of the guide block 120 to function properly. In one embodiment, the wafer carrier 160 may be, but is not limited to, a front opening unified pod (FOUP). Furthermore, in one embodiment, the inclined portion 120b may include a chamfer r as shown in FIG. 2. In addition, in one embodiment, the base surface 112 may have adjustment holes 112a corresponding to the guide blocks 120, and the shape of the adjustment holes 112a may be elongated, with the length of the elongated hole being greater than its width. If necessary, the adjustment holes 112a can cooperate with fastening members such as screws (not shown) to adjust the position of the guide block 120 on the base surface 112 to a limited extent.

Referring to FIG. 1 again, in this embodiment, at least one pair of fixed nozzles 142 (two pairs of fixed nozzles 142 are shown in FIG. 1) and at least one pair of retractable nozzles 144 are provided in the wafer carrier accommodation area R. The fixed nozzles 142 may function as inlet ports 142a and outlet ports 142b, and the retractable nozzles 144 may function as an inlet port 144a and an outlet port 144b. The fixed nozzles 142 and the retractable nozzles 144 are in fluid communication with different gas channels to deliver clean gas into the wafer carrier 160. Clean gas may be, for example, pure dry air (CDA), extremely pure dry air (X-CDA), or inert gas (such as nitrogen). In this embodiment, a height h1 of the apex of the fixed nozzle 142 relative to the base surface 112 is smaller than a height h of the apex of the vertical portion 120a of the guide block 120 relative to the base surface 112. Furthermore, a height h2 of the apex of the retractable nozzle 144 relative to the base surface 112 is smaller than the height T of the apex of the positioning pin 130 relative to the base surface 112, and the height h2 is greater than the height h1 of the apex of the fixed nozzle 142 relative to the base surface 112. By the above height difference designs among the fixed nozzles 142, the retractable nozzles 144, the positioning pins 130 and the vertical portion 120a of the guide block 120, during the process of guiding the wafer carrier 160 by the guide block 120, engaging the wafer carrier 160 onto the positioning pins 130 and communicating the wafer carrier 160 with the nozzles 142 and 144, the possibility that the moving wafer carrier 160 interferes with other components such as nozzles can be reduced. This may result in a smoother movement of the wafer carrier 160 and ensure airtightness and positioning reliability during gas filling. Furthermore, it should be noted a bottom mechanism (not shown) of a wafer carrier 160 suitable for fixed nozzles 142 is different to a bottom mechanism (not shown) of the wafer carrier 160 suitable for retractable nozzles 144. Therefore, when a wafer carrier 160 having a bottom mechanism suitable for fixed nozzles 142 is placed on the carrier substrate 110, the retractable nozzles 144, due to the retractable characteristic, would not interfere with the movement of such wafer carrier 160.

Figure 3:
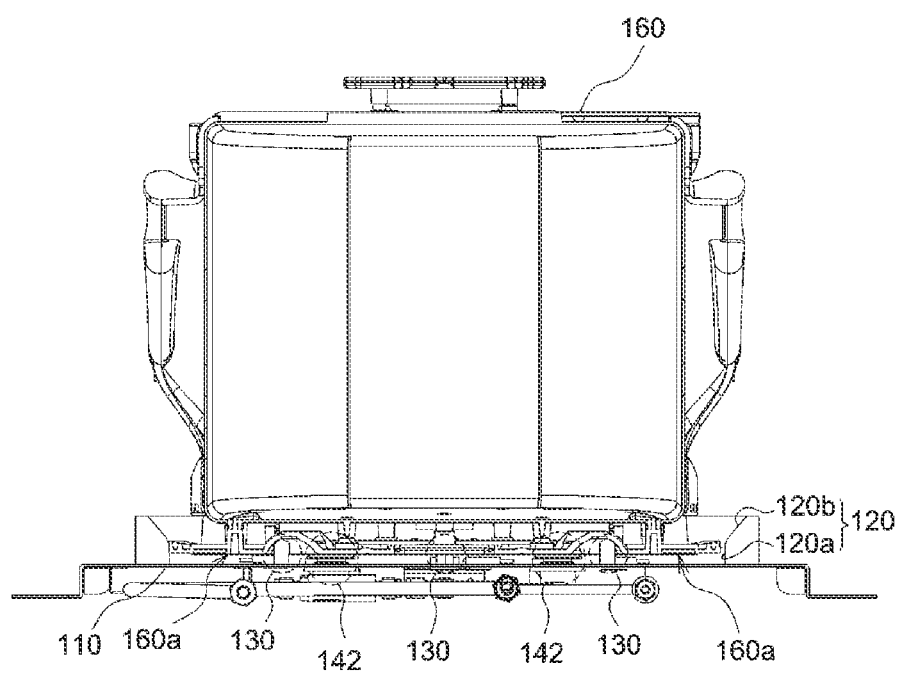
FIG. 3 is a schematic diagram of a wafer carrier mounted on a gas-filling docking tray according to an embodiment of the invention.

FIG. 3 shows a schematic diagram of a wafer carrier mounted on a gas filling docking tray according to an embodiment of the invention. As shown in FIG. 3, the wafer carrier 160 such as a front opening unified pod (FOUP) is inserted onto the positioning pins 130 by the guidance of the guide blocks 120. The inclined surface of the inclined portion 120b of each guide block 120 may assist the wafer carrier 160 to slide smoothly, and then the height difference of the vertical portion 120a of each guide block 120 may precisely make the wafer carrier 160 fall onto the positioning pins 130. The guiding effect generated by the inclined surface and vertical surface of the guide block 120 can avoid abnormal gas inflation caused by positional errors between nozzles and wafer carrier 160 in loading and unloading goods. Besides, by the height relationships set among the fixed nozzles 142, the retractable nozzles 144, the positioning pins 130, the vertical portions 120a and the inclined portions 120b of the guide blocks 120, the positioning process of the wafer carrier 160 can be smoother, and airtightness and positioning reliability during gas filling can be further ensured. The guide blocks 120 may be made of a plastic material such as polyoxymethylene, ultra-high molecular weight polyethylene (UPE), polytetrafluoroethylene or acrylic, but the invention is not limited thereto. In one embodiment, as shown in FIG. 3, the bottom 160a of the wafer carrier 160 that has been positioned on the carrier substrate 110 is more than 1 mm below the apex of the vertical portion 120a of each guide block 120.

Figure 4A:
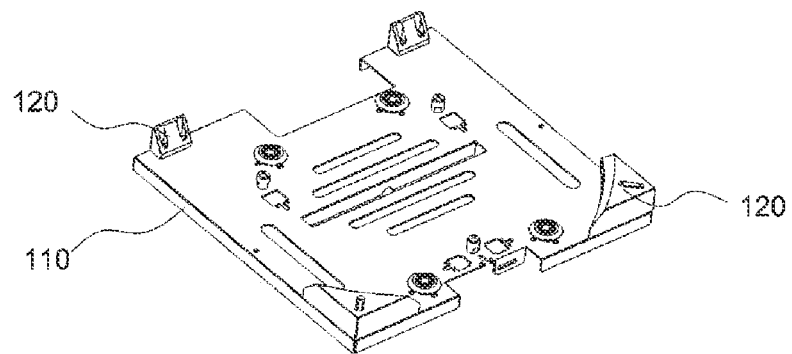
FIGS. 4A and 4B are schematic diagrams showing different arrangements of guide blocks according to various embodiments of the invention.
Figure 4B:
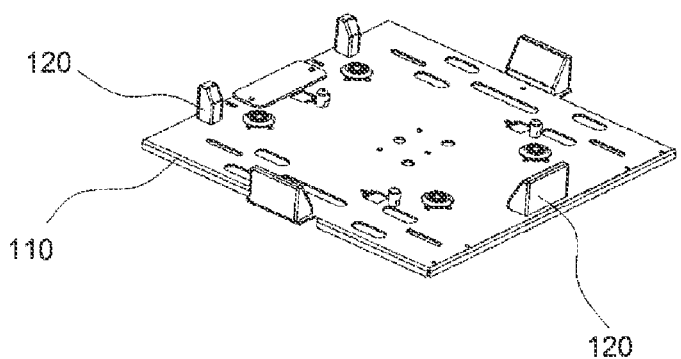

Furthermore, the guide blocks 120 only need to be provided on at least two opposite sides of the base surface 112 of the carrier substrate 110 and to have both vertical and inclined portions for guiding the wafer carrier 160, but the number, size, shape, distribution and position of the guide blocks 120 may vary according to actual needs without limitation. As shown in FIG. 4A, a plurality of guide blocks 120 of the gas filling docking tray 100A may have a linear symmetrical distribution on the carrier substrate 110. Furthermore, as shown in FIG. 4B, in another embodiment, the guide block 120 provided on the gas filling docking tray 100B may be a columnar body without a bending structure.

Figure 5:
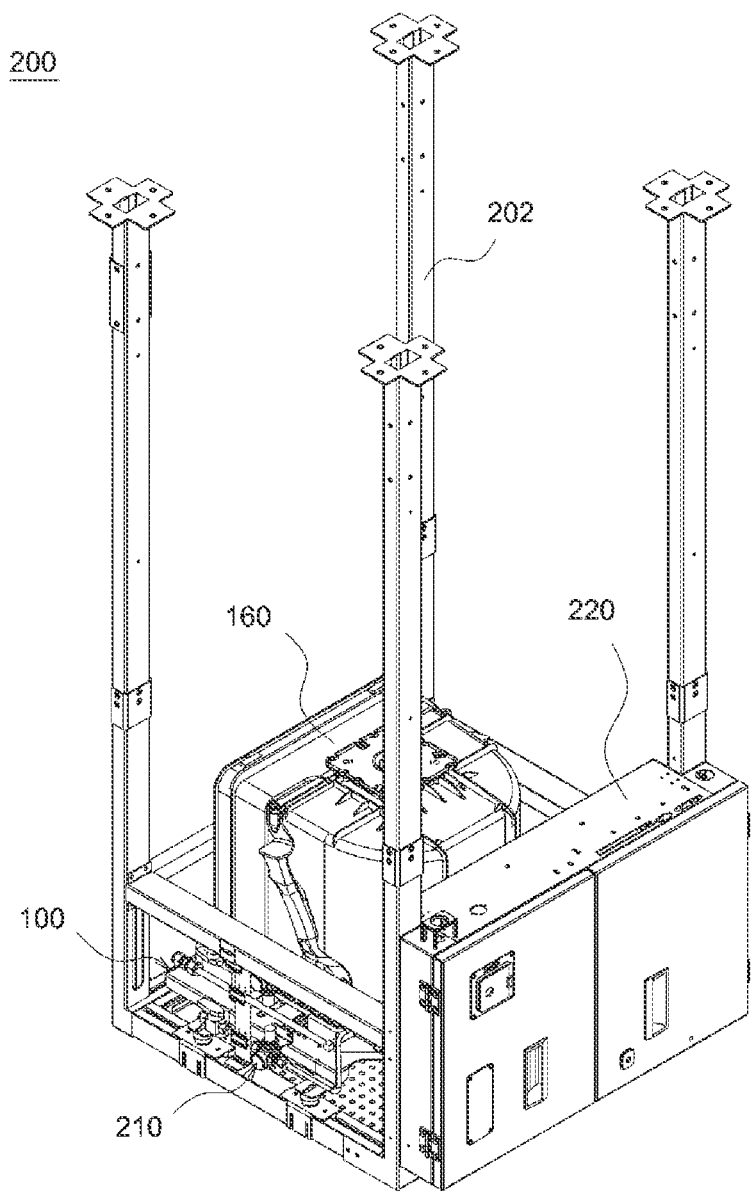
FIG. 5 is a schematic diagram of an overhead hoist buffer having the gas filling docking tray of FIG. 1 according to an embodiment of the invention.
Figure 6:
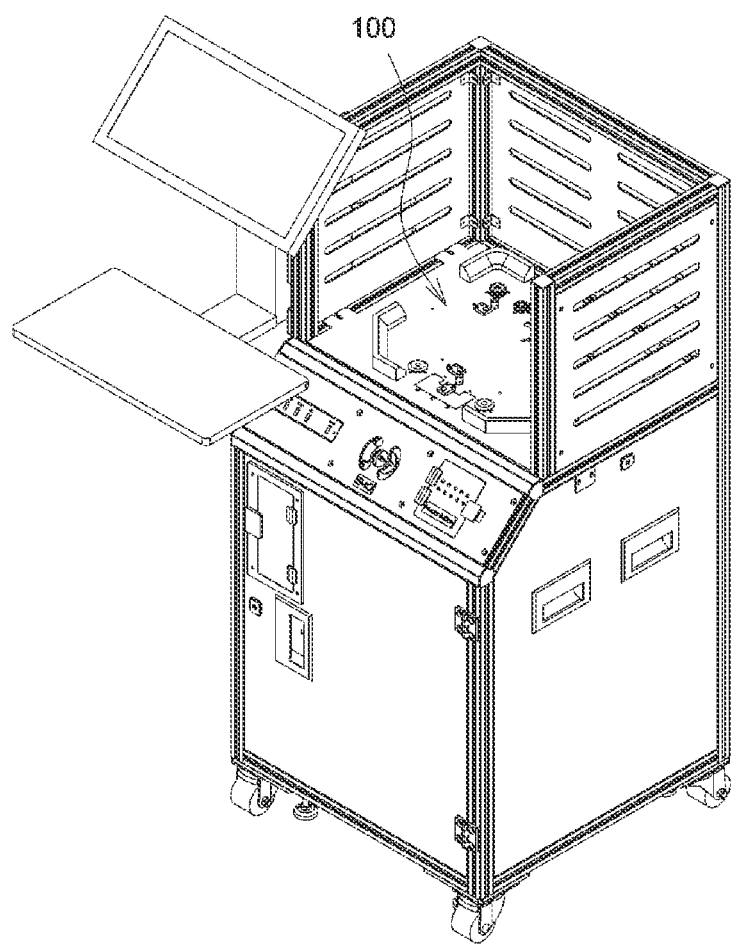
FIG. 6 is a schematic diagram of a standalone purge station having the gas filling docking tray of FIG. 1 according to an embodiment of the invention.
Figure 7:
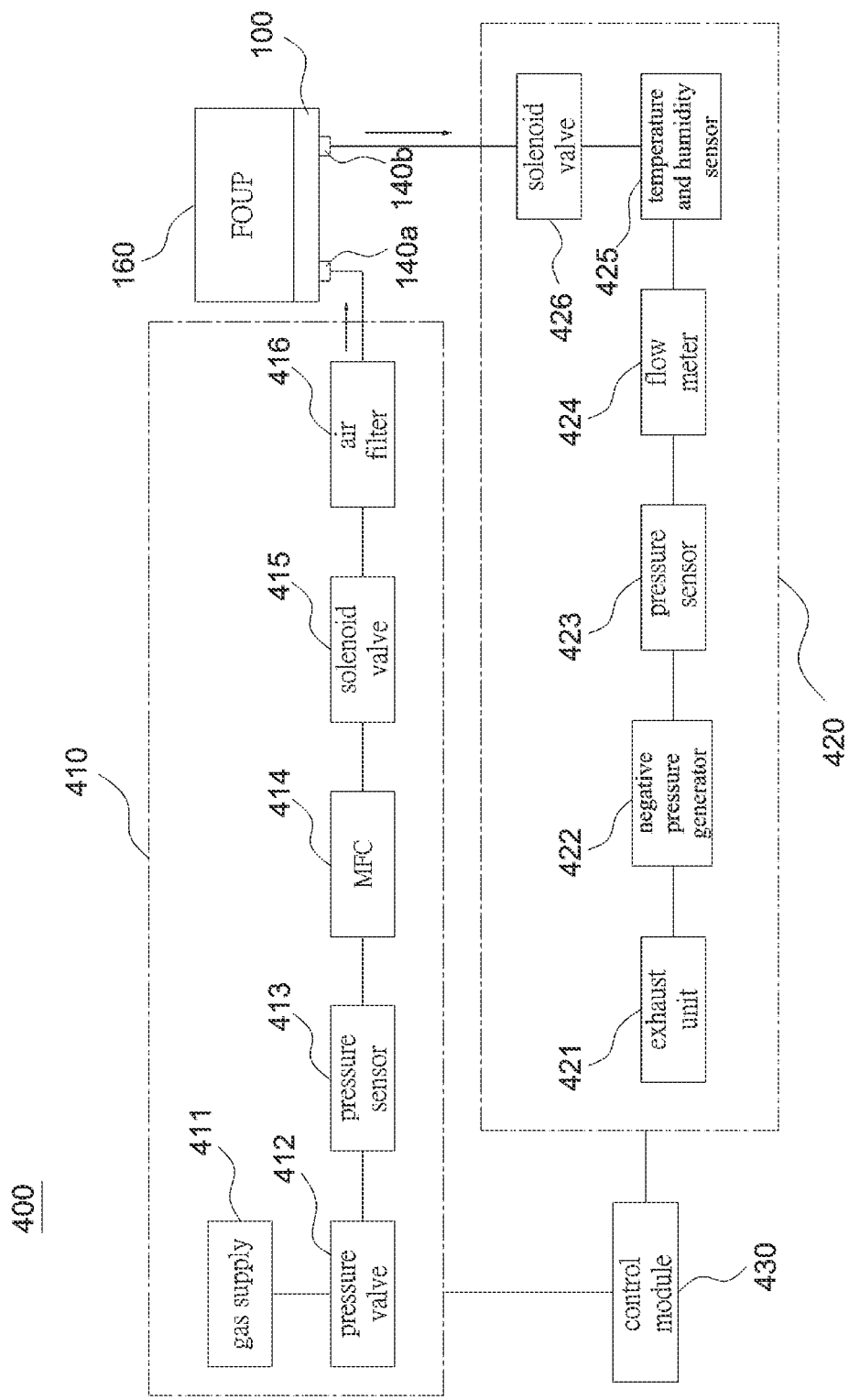
FIG. 7 is a block diagram of a gas filling device according to an embodiment of the invention.

The gas filling docking tray according to various embodiments of the invention can be used in various types of transportation module or system for transportation semiconductor material without limitation. In one embodiment, the gas filling docking tray 100 can be provided in an overhead transport system, such as being used in an overhead hoist buffer (OHB), an under track storage (UTS), or a side track Buffer (STB). For example, as shown in FIG. 5, in an overhead hoist buffer 200, the gas filling docking tray 100 is installed at the bottom of a plurality of vertical rods 202. The wafer carrier 160 transported by an overhead hoist transport (OHT) (not shown) is placed on the gas filling docking tray 100, and an inflation/exhaust module 210 connects nozzles of the gas filling docking tray 100 to inflate the wafer carrier 160 and thus replace the air inside the wafer carrier 160 with clean gas to meet required process standards. A control module 220 is electrically connected with the inflation/exhaust module 210 to control the operation of the inflation/exhaust module 210 to exchange gas in the wafer carrier 160, and the control module 220 may detect and monitor the gas pressure, flow rate, temperature, humidity, oxygen concentration and other parameters of the pipeline. In other embodiment, the gas filling docking tray 100 may be provided in a ground workstation such as a standalone purge station or a dummy load port. For example, FIG. 6 shows the configuration of the gas filling docking tray 100 in a standalone purge station 300. As shown in FIG. 6, the gas filling docking tray 100 is disposed beside the process equipment far from the warehouse storage system to inflate the wafer carrier (not shown) placed on the gas filling docking tray 100 and thus provide the effect of, for example, removing moisture and oxygen. FIG. 7 is a block diagram of a gas filling device according to an embodiment of the invention, and the gas filling device can be used in a standalone purge station, a dummy load port, an overhead hoist buffer (OHB), an under track storage (UTS) or a side track Buffer (STB) without limitation. As shown in FIG. 7, the gas filling device 400 includes an inflation module 410, an exhaust module 420, a control module 430, and a gas filling docking tray 100. The inflation module 410 is connected to an inlet port 140a of the gas filling docking tray 100 to inflate the wafer carrier 160, and the exhaust module 420 is connected to the outlet port 140b of the gas filling docking tray 100 to allow the gas inside the wafer carrier 160 to be discharged outward. The control module 430 is electrically connected to the inflation module 410 and the exhaust module 420 to control the operation of the inflation module 410 and the exhaust module 420. In one embodiment, the inflation module 410 may include a gas supply 411, a pressure valve 412, a pressure sensor 413, a mass flow controller (MFC) 414, a solenoid valve 415, and an air filter 416. The pressure valve 412 regulates the gas pressure of the gas from the gas supply 411 to the inflation pipeline, the pressure sensor 413 detects the gas pressure in the inflation pipeline, the mass flow controller 414 automatically controls the gas flow rate based on preset values to achieve a stable flow, and the air filter 416 filters out particles or specific molecules in the gas entering the wafer carrier 160. The control module 430 may control on/off operations of the solenoid valve 415 to selectively block the flow of gas into the wafer carrier 160. The exhaust module 420 may include an exhaust unit 421, a negative pressure generator 422, a pressure sensor 423, a flow meter 424, a temperature and humidity sensor 425, and a solenoid valve 426. The exhaust unit 421 can be controlled by the control module 430 to discharge the gas inside the wafer carrier 160 outward. The control module 430 may controls on/off operations of the solenoid valve 426 to selectively block the gas discharge. The negative pressure generator 422 may create a negative pressure in the exhaust pipeline to accelerate the discharge of gas. For example, the negative pressure generator 422 may be a vacuum generator. The flow meter 424 detects the gas flow rate through the exhaust pipeline, the pressure sensor 423 detects the gas pressure in the exhaust pipeline, and the temperature and humidity sensor 425 detects the humidity and temperature of the gas in the exhaust pipeline to monitor the gas state inside the wafer carrier 160. In one embodiment, other detectors (such as detectors for detecting the concentration, acidity, and alkalinity of specific gases) may be included, and the control module 430 may control the gas exchange inside the wafer carrier 160 based on the signals transmitted by various detectors. The control module 430 may be a circuit board with a microprocessor, but the invention is not limited thereto.

According to the above embodiments, the inclined portion may cooperate with the vertical portion of the guide block to guide a wafer carrier to a preset position during the process of positioning the wafer carrier on a gas filling docking tray, thereby avoiding abnormal gas inflation caused by loading and unloading positional errors. Moreover, by setting height relationships among the positioning pin, the vertical portion and the inclined portion of the guide block, the process of placing the wafer carrier onto a carrier substrate can be smoother and ensure proper functioning of each part of the guide block. Additionally, by adjusting the height relationships among the fixed nozzles, retractable nozzles, positioning pin, vertical portion and inclined portion of the guide block, the positioning process of the wafer carrier can be smoother, and airtightness and positioning reliability during gas filling can be further ensured.

The foregoing description of the preferred embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to best explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to particularly preferred exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. The abstract of the disclosure is provided to comply with the rules requiring an abstract, which will allow a searcher to quickly ascertain the subject matter of the technical disclosure of any patent issued from this disclosure. It is submitted with the understanding that it will not be used to interpret or limit the scope or meaning of the claims. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A gas filling docking tray, comprising:
   a carrier substrate having a base surface;
   a plurality of guide blocks at least disposed on two opposite sides of the base surface to define a wafer carrier accommodation area, each guide block comprising a vertical portion substantially perpendicular to the base surface and an inclined portion located above and connected with the vertical portion;
   a plurality of positioning pins disposed in the wafer carrier accommodation area of the carrier substrate to position a wafer carrier, wherein a height of an apex of each of the positioning pins relative to the base surface is greater than a height of an apex of the vertical portion relative to the base surface and less than a height of an apex of the inclined portion relative to the base surface; and
   at least one pair of nozzles disposed in the wafer carrier accommodation area.

2. The gas filling docking tray as claimed in claim 1, wherein the at least one pair of nozzles includes a pair of fixed nozzles, and a height of an apex of each of the fixed nozzles relative to the base surface is less than the height of the apex of the vertical portion relative to the base surface.

3. The gas filling docking tray as claimed in claim 2, wherein the at least one pair of nozzles further includes a pair of retractable nozzles, and a height of an apex of each of the retractable nozzles relative to the base surface is less than the height of the apex of each of the positioning pins relative to the base surface and greater than the height of the apex of each of the fixed nozzles relative to the base surface.

4. The gas filling docking tray as claimed in claim 1, wherein at least one of the guide blocks has a bending structure.

5. The gas filling docking tray as claimed in claim 1, wherein an angle between the inclined portion of each of the guide blocks and a normal line of the base surface ranges from 10 degrees to 70 degrees.

6. The gas filling docking tray as claimed in claim 1, wherein a bottom of the wafer carrier poisoned on the carrier substrate is more than 1 mm below the apex of the vertical portion.

7. The gas filling docking tray as claimed in claim 1, wherein the base surface is provided with a plurality of adjustment holes corresponding to the guide blocks to provide an adjustable fixed position on the base surface for each of the guide blocks.

8. The gas filling docking tray as claimed in claim 1, wherein the wafer carrier is a front-opening unified pod (FOUP).

9. The gas filling docking tray as claimed in claim 1, wherein the gas filling docking tray is used in an overhead hoist buffer (OHB), an under track storage (UTS), a stand-alone purge station, a side track buffer (STB), or a dummy load port.

10. A gas filling docking tray, comprising:
    a carrier substrate having a base surface;
    at least three guide blocks disposed on a peripheral area of the base surface and spaced apart from each other to define a wafer carrier accommodation area, each guide block comprising a vertical portion substantially perpendicular to the base surface and an inclined portion located above and connected with the vertical portion;

a plurality of positioning pins disposed in the wafer carrier accommodation area of the carrier substrate to position a wafer carrier, wherein a height of an apex of each of the positioning pins relative to the base surface is greater than a height of an apex of the vertical portion relative to the base surface and less than a height of an apex of the inclined portion relative to the base surface;

at least one pair of fixed nozzles disposed in the wafer carrier accommodation area, wherein a height of an apex of each of the fixed nozzles relative to the base surface is less than the height of the apex of the vertical portion relative to the base surface; and at least one pair of retractable nozzles disposed in the wafer carrier accommodation area, wherein a height of an apex of each of the retractable nozzles relative to the base surface is less than the height of the apex of each of the positioning pins relative to the base surface and greater than the height of the apex of each of the fixed nozzles relative to the base surface.

11. The gas filling docking tray as claimed in claim 10, wherein at least one of the guide blocks has a bending structure.

12. The gas filling docking tray as claimed in claim 10, wherein an angle between the inclined portion of each of the guide blocks and a normal line of the base surface ranges from 10 degrees to 70 degrees.

13. The gas filling docking tray as claimed in claim 10, wherein a bottom of the wafer carrier poisoned on the carrier substrate is more than 1 mm below the apex of the vertical portion.

14. The gas filling docking tray as claimed in claim 10, wherein the base surface is provided with a plurality of adjustment holes corresponding to the guide blocks to provide an adjustable fixed position on the base surface for each of the guide blocks.

15. The gas filling docking tray as claimed in claim 10, wherein the wafer carrier is a front-opening unified pod (FOUP).

16. The gas filling docking tray as claimed in claim 10, wherein the gas filling docking tray is used in an overhead hoist buffer (OHB), an under track storage (UTS), a stand-alone purge station, a side track buffer (STB), or a dummy load port.

17. The gas filling docking tray as claimed in claim 10, wherein the guide blocks are made from polyoxymethylene, ultra-high molecular weight polyethylene (UPE), polytetrafluoroethylene (PTFE) or acrylic.

18. A gas filling device comprising:
a carrier substrate having a base surface;
a plurality of guide blocks at least disposed on two opposite sides of the base surface to define a wafer carrier accommodation area, each guide block comprising a vertical portion substantially perpendicular to the base surface and an inclined portion located above and connected with the vertical portion;
a plurality of positioning pins disposed in the wafer carrier accommodation area of the carrier substrate to position a wafer carrier, wherein a height of an apex of each positioning pins relative to the base surface is greater than a height of an apex of the vertical portion relative to the base surface and less than a height of an apex of the inclined portion relative to the base surface;
at least one inlet port and at least one outlet port disposed in the wafer carrier accommodation area;
an inflation module in fluid communication with the at least one inlet port;
an exhaust module in fluid communication with the at least one outlet port; and
a control module electrically connected to the inflation module and the exhaust module to control operations of the inflation module and the exhaust module.

* * * * *